(12) United States Patent
Hyun et al.

(10) Patent No.: US 9,093,606 B2
(45) Date of Patent: Jul. 28, 2015

(54) THERMOELECTRIC DEVICES

(75) Inventors: Younghoon Hyun, Seoul (KR); Moon Gyu Jang, Daejeon (KR); Young Sam Park, Daejeon (KR); Taehyoung Zyung, Daejeon (KR); Yil Suk Yang, Daejeon (KR); Jong-Kee Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 321 days.

(21) Appl. No.: 13/611,189

(22) Filed: Sep. 12, 2012

(65) Prior Publication Data

US 2013/0139864 A1 Jun. 6, 2013

(30) Foreign Application Priority Data

Dec. 2, 2011 (KR) .................. 10-2011-0128273

(51) Int. Cl.
*H01L 35/30* (2006.01)
*H01L 35/32* (2006.01)
*B82Y 30/00* (2011.01)

(52) U.S. Cl.
CPC *H01L 35/32* (2013.01); *B82Y 30/00* (2013.01)

(58) Field of Classification Search
CPC ........................................... H01L 35/00–35/34
USPC .................................. 136/200–242
See application file for complete search history.

(56) References Cited

U.S. PATENT DOCUMENTS

| 6,605,772 B2 | 8/2003 | Harman et al. | |
|---|---|---|---|
| 2008/0178921 A1* | 7/2008 | Ye | 136/225 |
| 2009/0020148 A1 | 1/2009 | Boukai et al. | |
| 2010/0198204 A1* | 8/2010 | Rogers | 606/21 |
| 2010/0236596 A1* | 9/2010 | Lee et al. | 136/230 |
| 2010/0252086 A1* | 10/2010 | Fujie | 136/238 |
| 2012/0145210 A1* | 6/2012 | Ashkenazi | 136/200 |

FOREIGN PATENT DOCUMENTS

GB WO2010115776 * 10/2010

OTHER PUBLICATIONS

Allon I. Hochbaum et al., "Enhanced thermoelectric performance of rough silicon nanowires", Nature06381, Jan. 10, 2008, pp. 163-168, vol. 451, No. 10.
Akram I. Boukai et al., "Silicon nanowires as efficient thermoelectric materials", Nature06458, Jan. 10, 2008, pp. 168-171, vol. 451, No. 10.

* cited by examiner

*Primary Examiner* — Bach Dinh
(74) *Attorney, Agent, or Firm* — Rabin & Berdo, P.C.

(57) ABSTRACT

Provided is a thermoelectric device including two legs having a rough side surface and a smooth side surface facing each other. Phonons may be scattered by the rough side surface, thereby decreasing thermal conductivity of the device. Flowing paths for electrons and phonons may become different form each other, because of a magnetic field induced by an electric current passing through the legs. The smooth side surface may be used for the flowing path of electrons. As a result, in the thermoelectric device, thermal conductivity can be reduced and electric conductivity can be maintained.

20 Claims, 7 Drawing Sheets

THERMOELECTRIC DEVICES

CROSS-REFERENCE TO RELATED APPLICATIONS

This U.S. non-provisional patent application claims priority under 35 U.S.C. §119 to Korean Patent Application No. 10-2011-0128273, filed on Dec. 2, 2011, in the Korean Intellectual Property Office, the entire contents of which are hereby incorporated by reference.

BACKGROUND OF THE INVENTION

Embodiments of the inventive concepts relate to a thermoelectric device, and in particular, to a thermoelectric device including a pair of legs with rugged portions.

Since the use of fossil fuels causes various environmental problems, such as atmospheric pollution, global warming, or an increasing amount of carbon dioxide in the atmosphere, there is a need to replace the fossil fuels with alternative clean energy. One of clean energy sources is a thermoelectric device converting thermal energy into electrical energy. A heat source of the thermoelectric device may be radiant heat (e.g., solar heat), terrestrial heat, body heat, waste heat, and so forth.

The sun is an inexhaustible source of heat energy that is free from environmental pollution. In this sense, there is a need to develop highly efficient thermoelectric devices for using solar heat.

Thermoelectric efficiency of thermoelectric devices may be represented by a value of ZT (Figure of Merit). The value of ZT is proportional to the square of Seebeck coefficient and to electric conductivity, but inversely proportional to thermal conductivity. In most cases, electric conductivity and thermal conductivity of a material have a proportional relationship to each other, and thus, it is hard to increase a value of ZT.

SUMMARY

Embodiments of the inventive concepts provide thermoelectric devices with improved thermoelectric efficiency.

Other embodiments of the inventive concepts provide thermoelectric generators with the thermoelectric device.

According to example embodiments of the inventive concepts, a thermoelectric device may include a first terminal, a second terminal spaced apart from the first terminal, a first leg provided between the first and second terminals to connect the first terminal with the second terminal, and a second leg between the first and second terminals to connect the first terminal with the second terminal. Here, the first and second legs may face each other. Each of the first and second legs may include first and second side surfaces facing each other and having different surface roughness from each other.

In example embodiments, the first and second legs may be disposed in such a way that the first side surfaces thereof face each other, and the first side surfaces may be smoother than the second side surfaces.

In example embodiments, the second side surfaces may be formed to have at least one rugged portion.

In example embodiments, the first and second legs may be nanowires.

In example embodiments, the first and second legs include a layer of graphene.

In example embodiments, a space between the first leg and the second leg ranges from 1 nm to 1 µm.

In example embodiments, the nanowire may include at least one of Bi, Te, Sb, Si, Ge, C, Sn, or Pb.

In example embodiments, the nanowire may be selectively doped with one of N, P, As, and Sb to have n-type conductivity.

In example embodiments, the nanowire may be selectively doped with one of B, Al, Ga, and In to have p-type conductivity.

In example embodiments, the first and second legs have the same conductivity type as each other.

In example embodiments, the first and second terminals may be formed of the same material as the first and second legs.

In example embodiments, the first and second terminals may be formed of a different material from the first and second legs.

According to example embodiments of the inventive concepts, a thermoelectric generator may include first and second electrodes adjacent to each other, a common electrode spaced apart from the first and second electrodes, a first thermoelectric device provided between the first electrode and the common electrode to connect the first electrode to the common electrode, and a second thermoelectric device provided between the second electrode and the common electrode to connect the second electrode to the common electrode. Each of the first and second thermoelectric devices may include a first terminal, a second terminal spaced apart from the first terminal, a first leg provided between the first and second terminals to connect the first terminal with the second terminal, and a second leg between the first and second terminals to connect the first terminal with the second terminal. Here, the first and second legs may face each other. Each of the first and second legs may include first and second side surfaces facing each other and having different surface roughness from each other.

In example embodiments, the first and second legs may be disposed in such a way that the first side surfaces thereof face each other, and the first side surfaces may be smoother than the second side surfaces.

In example embodiments, the first thermoelectric device may be configured to have n-type conductivity, and the second thermoelectric device may be configured to have p-type conductivity.

According to example embodiments of the inventive concepts, a thermoelectric generator may include first and second electrodes adjacent to each other, a common electrode spaced apart from the first and second electrodes, a first leg provided between the common and first electrodes to connect the common electrode to the first electrode, a second leg provided between the common and second electrodes to connect the common electrode to second electrode, the first and second legs facing each other. Each of the first and second legs may include first and second side surfaces facing each other and having different surface roughness from each other.

In example embodiments, the first and second legs may be disposed in such a way that the second side surfaces thereof face each other, and the second side surfaces may be rougher than the first side surfaces.

In example embodiments, the first leg may be an n-type nanowire, and the second leg may be a p-type nanowire.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of the inventive concept, a thermoelectric device may be configured in such a way that electric conductivity thereof is maintained or improved and thermal conductivity thereof is reduced.

Figure 1:
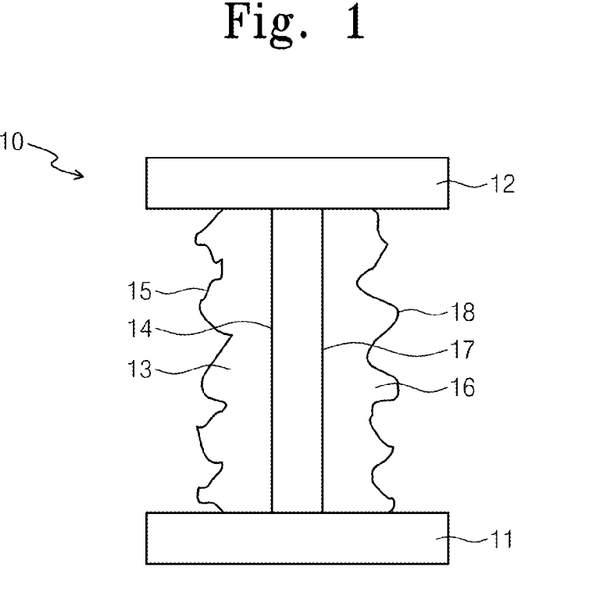
FIG. 1 is a vertical sectional view illustrating a thermoelectric device according to example embodiments of the inventive concept.
Figure 2:
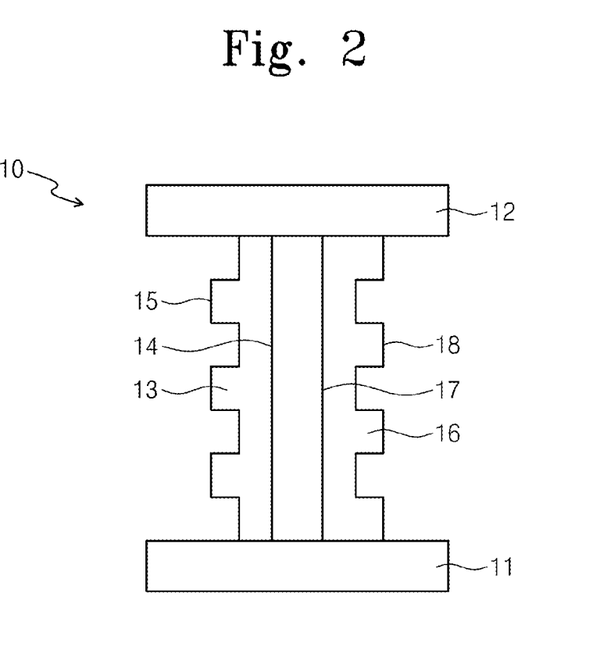
FIG. 2 is a vertical sectional view illustrating a rugged portion of a thermoelectric device according to a first modified example of example embodiments of the inventive concept.
Figure 3:
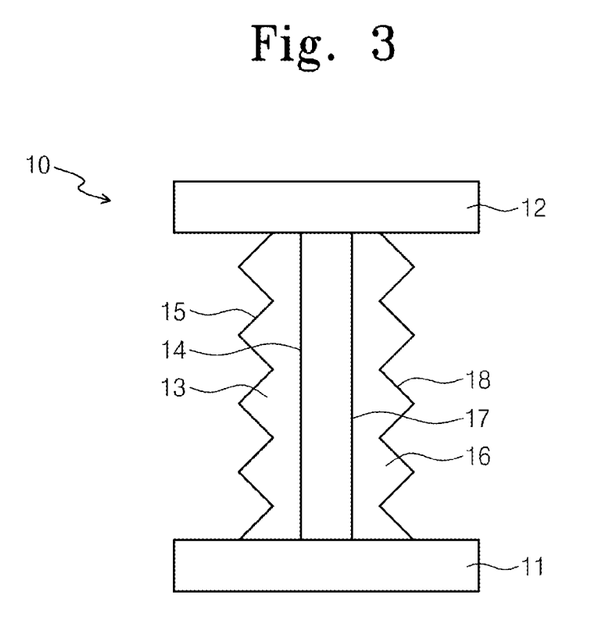
FIG. 3 is a vertical sectional view illustrating a rugged portion of a thermoelectric device according to a second modified example of example embodiments of the inventive concept.
Figure 4:
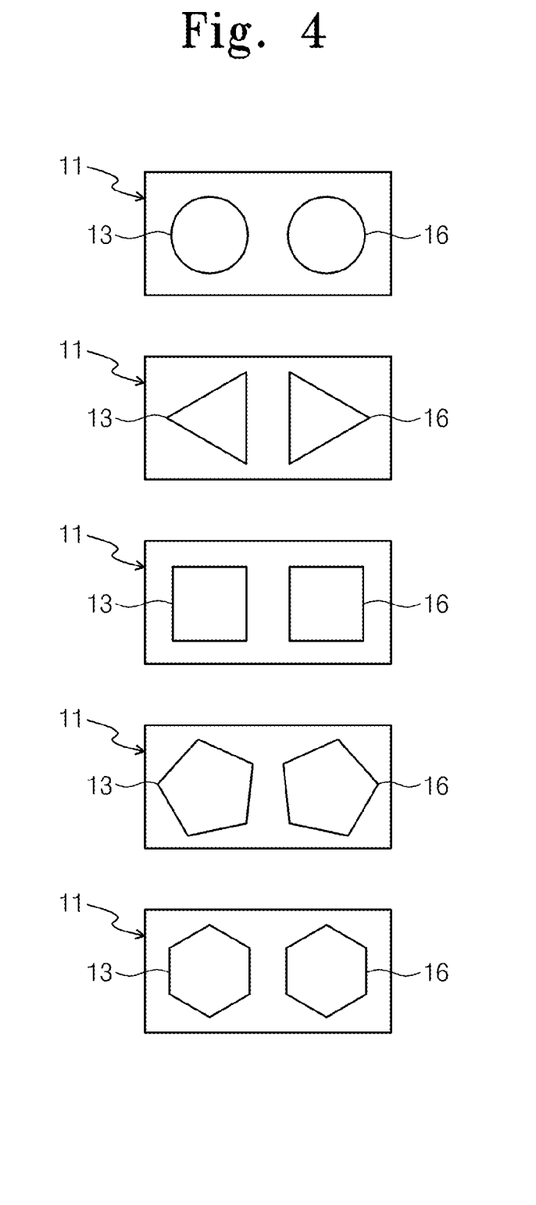
FIG. 4 shows horizontal sectional views of legs according to example embodiments of the inventive concept.

FIG. 1 is a vertical sectional view illustrating a thermoelectric device according to example embodiments of the inventive concept, and FIG. 2 is a vertical sectional view illustrating a rugged portion of a thermoelectric device according to a first modified example of example embodiments of the inventive concept. FIG. 3 is a vertical sectional view illustrating a rugged portion of a thermoelectric device according to a second modified example of example embodiments of the inventive concept, and FIG. 4 shows horizontal sectional views of legs according to example embodiments of the inventive concept.

Referring to FIG. 1, a thermoelectric device 10 may include a first terminal 11, a first leg 13, a second leg 16 facing the first leg 13, and a second terminal 12.

For the sake of simplicity, the description that follows will refer to an example of the present embodiment in which the second terminal 12 has a temperature higher than the first terminal 11. The first and second terminals 11 and 12 may include at least one of Bi, Te, Sb, Si, Ge, C, Sn, and Pb, as a main element thereof. The first terminal 11 may be connected to the second terminal 12 by the first and second legs 13 and 16. In other words, the first and second legs 13 and 16 may be provided between the first terminal 11 and the second terminal 12. In example embodiments, heat supplied from the outside may be absorbed by the second terminal 12 and then be exhausted outward from the first terminal 11 through first and second legs 13 and 16. The first leg 13 may be disposed parallel to the second leg 16. In example embodiments, the first leg 13 may be spaced, by an interval ranging from 1 nm to 1 μm, apart from the second leg 16.

The first leg 13 may include a first surface 14 and a first uneven surface 15 facing each other. In example embodiments, the first surface 14 may be configured to have a smooth surface, while the first uneven surface 15 may be configured to have a rugged portion. In other words, the first uneven surface 15 may be rougher than the first surface 14. The second leg 16 may include a second surface 17 and a second uneven surface 18 facing each other. The second surface 17 may be configured to have a smooth surface, while the second uneven surface 18 may be configured to have a rugged portion. In other words, the second uneven surface 18 may be rougher than the second surface 17. In example embodiments, the first surface 14 may be disposed to face the second surface 17.

Referring to FIGS. 2 and 3, the rugged portions of the first and second uneven surfaces 15 and 18 may shaped like triangular sawteeth or rectangular sawteeth. The first and second uneven surfaces 15 and 18 may be formed in such a way that a maximal depth or height of the rugged portions thereof ranges from 1 nm to 1 μm.

The first and second legs 13 and 16 may be a nano structure having a thermoelectric property. In example embodiments, the nano structure may be a one-dimensional or two-dimensional nano structure. For example, a nanowire may be used as the one-dimensional nano structure, and a graphene may be used as the two-dimensional nano structure.

Referring to FIG. 4, the nanowire may have a horizontal section shaped like at least one of circle, triangle, rectangle, pentagon, and hexagon. conductivity type of the nanowire may be n-type or p-type. The nanowire may include at least one of Bi, Te, Sb, Si, Ge, C, Sn, or Pb, as a main element thereof. The nanowire may be doped with group-V elements to have the n-type conductivity. Alternatively, the nanowire may be doped with group-III elements to have the p-type conductivity. In example embodiments, at least one of N, P, As, or Sb may be used as the group-V elements, and at least one of B, Al, Ga, or In may be used as the group-III elements. The nanowire may be formed to have a line width ranging from 1 nm to 5 μm. In example embodiments, all the first and second legs 13 and 16 and the first and second terminals 11 and 12 may have the same conductivity type.

The formation of the first and second legs 13 and 16 and the first and second terminals 11 and 12 may include forming grooves in a substrate (not shown) and then filling the grooves with a thermoelectric material. In example embodiments, the substrate may be one of a silicon substrate, a glass substrate, a plastic substrate, a metal substrate, a silicon-on-insulator (SOI) substrate, or a stacking structure including at least two thereof.

Figure 5:
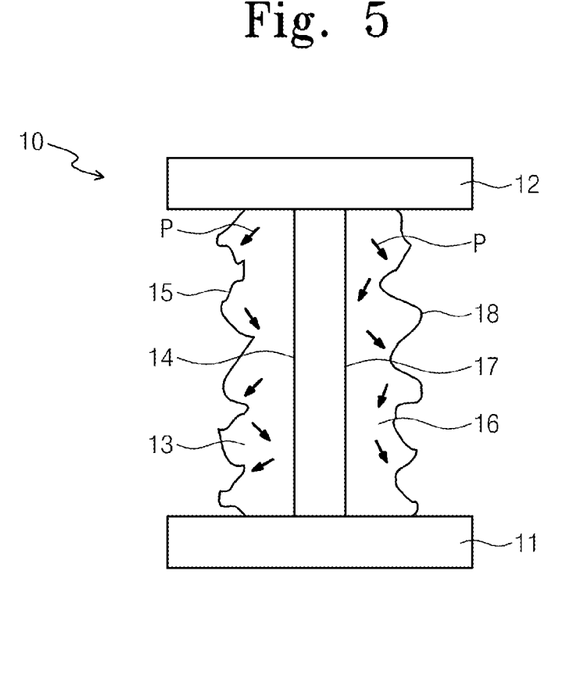
FIG. 5 is a sectional view illustrating a flow of phonons in a thermoelectric device according to example embodiments of the inventive concept.

FIG. 5 is a sectional view illustrating a flow of phonons in a thermoelectric device according to example embodiments of the inventive concept.

Referring to FIG. 5, heat absorbed through the second terminal 12 may be dissipated from the first terminal 11 through the first and second legs 13 and 16. The first uneven surface 15 of the first leg 13 and the second uneven surface 18 of the second leg 16 may have the rugged portions. Phonons P may be scattered by the rugged portions of the first and second uneven surfaces 15 and 18, and thus, thermal conductivity of the legs may decrease.

Figure 6:
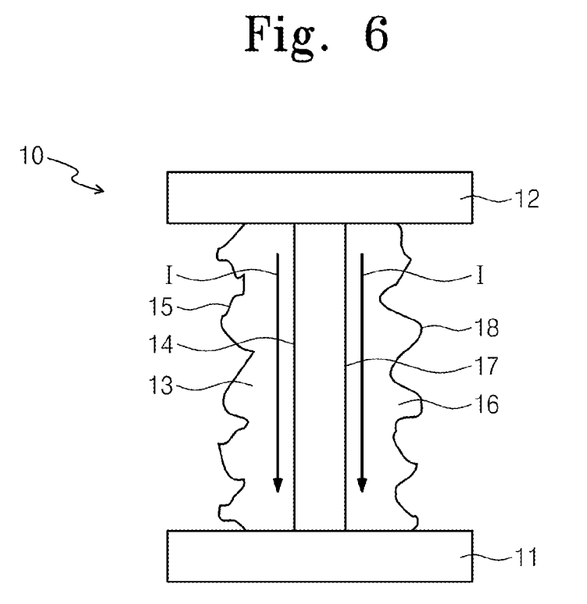
FIG. 6 is a sectional view illustrating a flow of an electric current in a thermoelectric device according to example embodiments of the inventive concept.

FIG. 6 is a sectional view illustrating a flow of an electric current in a thermoelectric device according to example embodiments of the inventive concept.

Referring to FIG. 6, there may be electric currents I flowing through the first and second legs 13 and 16 along the same direction. Arrows depicted in FIG. 6 represent the propagation direction of the electric current I. In the case where the first and second legs 13 and 16 have the n-type conductivity, the electric current I may flow from the first terminal 11 to the second terminal 12. In the case where the first and second legs 13 and 16 have the p-type conductivity, the electric current I may flow from the second terminal 12 to the first terminal 11. From Biot-Savart's law, a magnetic field may be generated around the first and second legs 13 and 16, through which the electric current flows. Furthermore, from Biot-Savart's law, interaction between electrons passing through the first and second legs 13 and 16 may be attractive, and owing to the presence of the attractive force, the electrons may flow along the first and second surfaces 14 and 17 facing each other. In this case, the scattering of electrons can be reduced by virtue of the smooth profiles of the first and second surfaces 14 and 17. As a result, electric conductivity of the thermoelectric device can be prevented from decreasing.

Figure 7:
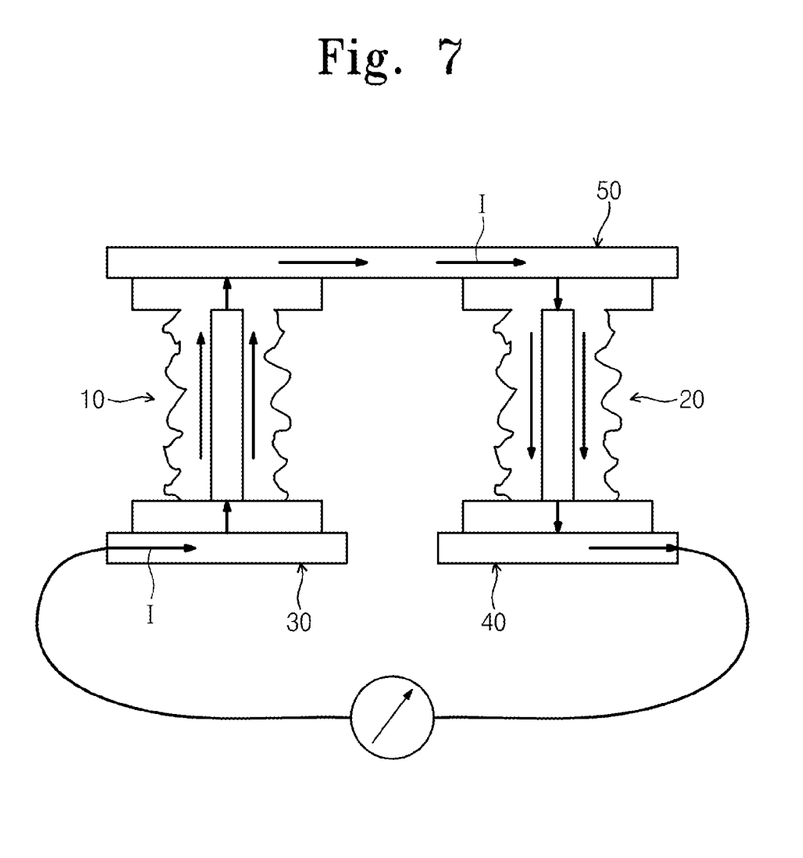
FIG. 7 is a schematic diagram illustrating a thermoelectric generator provided with a thermoelectric device according to example embodiments of the inventive concept.

FIG. 7 is a schematic diagram illustrating a thermoelectric generator provided with a thermoelectric device according to example embodiments of the inventive concept.

Referring to FIG. 7, the thermoelectric generator may include a first electrode 30, a second electrode 40, the first thermoelectric device 10, a second thermoelectric device 20, and a common electrode 50. Arrows depicted in FIG. 7 represent the propagation direction of the electric current I.

The first thermoelectric device 10 may be provided on the first electrode 30. The second thermoelectric device 20 may be provided on the second electrode 40. The common electrode 50 may be formed on the first and second thermoelectric devices 10 and 20. In other words, the first thermoelectric device 10 may be formed between the first electrode 30 and the common electrode 50, and the second thermoelectric device 20 may be formed between the second electrode 40 and the common electrode 50. Heat supplied from the outside may be absorbed by the common electrode 50, be passed through the first and second thermoelectric devices 10 and 20, and then be dissipated outward from the first and second electrodes 30 and 40. If heat is supplied to the common electrode 50, there may be a flow of an electric current generated by a difference in electric potential between the first and second thermoelectric devices 10 and 20.

Each of the first and second electrodes 30 and 40 may be a metal layer or a metal compound layer. The first and second electrodes 30 and 40 may include at least one of aluminum (Al), copper (Cu), tungsten (W), titanium (Ti), silver (Ag), gold (Au), platinum (Pt), nickel (Ni), carbon (C), molybdenum (Mo), tantalum (Ta), iridium (Ir), ruthenium (Ru), zinc (Zn), tin (Sn), or indium (In). At least one of the first and second electrodes 30 and 40 may include a doped semiconductor layer.

In example embodiments, the second thermoelectric device 20 may be configured to have the substantially same technical features as the first thermoelectric device 10 previously described with reference to FIGS. 1 through 6. In example embodiments, the first thermoelectric device 10 may be configured to have the n-type conductivity, while the second thermoelectric device 20 may be configured to have the p-type conductivity.

Figure 8:
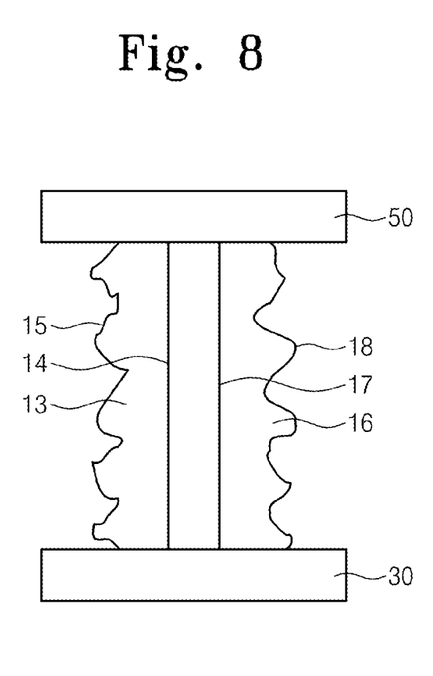
FIG. 8 is a sectional view illustrating a thermoelectric device according to other example embodiments of the inventive concept.

FIG. 8 is a sectional view illustrating a thermoelectric device according to other example embodiments of the inventive concept.

Referring to FIG. 8, a thermoelectric device according to other example embodiments of the inventive concept may include the first electrode 30, the first leg 13, the second leg 16, and the common electrode 50. In the present embodiments, the first and second legs 13 and 16 of the thermoelectric device may be directly connected to the first and second electrodes 30 and 50, without the first and second terminals 11 and 12 in the previous embodiments.

The first leg 13 may include the first surface 14 and the first uneven surface 15 facing each other. The second leg 16 may include the second surface 17 and the second uneven surface 18 facing each other. The first and second surface 14 and 17 may be smooth surfaces facing each other. The first and second uneven surfaces 15 and 18 may be rougher than the first and second surfaces 14 and 17.

Each of the first electrode 30 and the common electrode 50 may be a metal layer or a metal compound layer. The first electrode 30 and the common electrode 50 may include at least one of aluminum (Al), copper (Cu), tungsten (W), titanium (Ti), silver (Ag), gold (Au), platinum (Pt), nickel (Ni), carbon (C), molybdenum (Mo), tantalum (Ta), iridium (Ir), ruthenium (Ru), zinc (Zn), tin (Sn), or indium (In). At least one of the first electrode 30 and the common electrode 50 may include a doped semiconductor layer. The common electrode 50 may serve as a heat absorbing layer, while the first electrode 30 may serve as a heat emitting layer. For example, heat supplied from the outside may be absorbed by the common electrode 50 and then be exhausted outward from the first electrode 30 through the first and second legs 13 and 16.

The first and second legs 13 and 16 may be configured to have the substantially same technical features as those previously described with reference to FIGS. 1 through 6.

Figure 9:
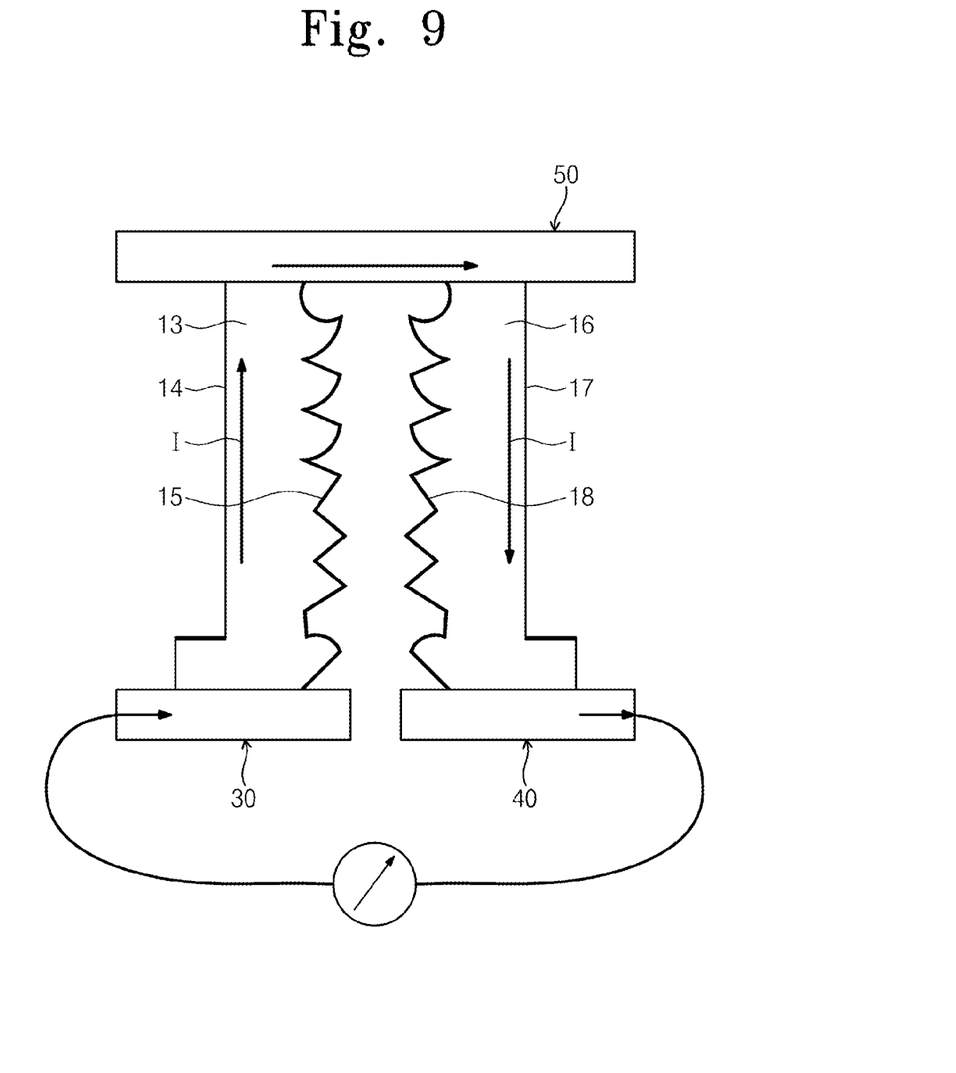
FIG. 9 is a sectional view illustrating a thermoelectric generator according to example embodiments of the inventive concept.

FIG. 9 is a sectional view illustrating a thermoelectric generator according to example embodiments of the inventive concept.

Referring to FIG. 9, the thermoelectric generator may include the first electrode 30, the second electrode 40, the first leg 13, the second leg 16, and the common electrode 50. The first leg 13 may include the first surface 14 and the first uneven surface 15 facing each other. The second leg 16 may include the second surface 17 and the second uneven surface 18 facing each other. The first and second uneven surfaces 15 and 18 may be rougher than the first and second surfaces 14 and 17. In example embodiments, the first and second uneven surfaces 15 and 18 may face each other between the first and second surfaces 14 and 17. The first leg 13 may be parallel to the second leg 16.

The first leg 13 may have different conductivity type from the second leg 16. For example, the first leg 13 may be an n-type nanowire, and the second leg 16 may be a p-type nanowire. In this case, an electric current I in the first leg 13 may flow from the first electrode 30 to the common electrode 50, while other electric current I in the second leg 16 may flow from the common electrode 50 to the second electrode 40. As a result, from Biot-Savart's law, interaction between electrons passing through the first and second legs 13 and 16 may be repulsive, and owing to the presence of the repulsive force exerting on electrons, the electrons may flow along the first and second surfaces 14 and 17. The common electrode 50 may serve as a heat absorbing layer, and the first and second electrodes 30 and 40 may serve as a heat emitting layer. For example, heat supplied from the outside may be absorbed by the common electrode 50 and then be exhausted outward from the first and second electrode 30 and 40 through the first and second legs 13 and 16. If heat is supplied to the common electrode 50, there may be a flow of an electric current generated by a difference in electric potential between the first and second legs 13 and 16.

According to example embodiments of the inventive concept, the thermoelectric device may include at least one nanowire structure having a rough side surface and a smooth side surface. Phonons may be scattered by the rough side surface, and thus, the nanowire structure may exhibit lowered thermal conductivity. A magnetic field may be induced by an electric current passing through the nanowire structure, and the presence of the magnetic field may result in a difference in flowing path between electrons and phonons. For example, electrons can be flowed along the smooth side surface by the magnetic field. As a result, thermal conductivity can be reduced and electric conductivity can be increased, and thus, it is possible to improve and maintain thermoelectric conversion efficiency of the thermoelectric device.

While example embodiments of the inventive concepts have been particularly shown and described, it will be understood by one of ordinary skill in the art that variations in form and detail may be made therein without departing from the spirit and scope of the attached claims.

What is claimed is:

1. A thermoelectric device, comprising:
   a first terminal;
   a second terminal spaced apart from the first terminal;
   a first leg provided between the first and second terminals to connect the first terminal with the second terminal; and
   a second leg provided between the first and second terminals to connect the first terminal with the second terminal, the first and second legs facing each other,
   wherein each of the first and second legs comprises a first side surface and an external second side surface facing each other and having different surface roughnesses from each other, the first side surface being flat and having a first end in direct contact with the first terminal and a second end in direct contact with the second terminal, a portion of the second side surface being disposed closer to the second terminal than the first terminal and being uneven so as to have a surface roughness which is different from that of the first side surface, and another portion of the second side surface being disposed closer to the first terminal than the second terminal and being uneven so as to have a surface roughness which is different from that of the first side surface.

2. The device of claim 1, wherein the first and second legs are disposed in such a way that the first side surfaces thereof face each other.

3. The device of claim 2, wherein the second side surfaces are formed to have at least one rugged portion.

4. The device of claim 1, wherein the first and second legs are nanowires.

5. The device of claim 4, wherein each of the nanowires comprises at least one selected from the group consisting of Bi, Te, Sb, Si, Ge, C, Sn, and Pb.

6. The device of claim 5, wherein each of the nanowires is selectively doped to have n-type conductivity with one selected from the group consisting of N, P, As, and Sb.

7. The device of claim 5, wherein each of the nanowires is selectively doped to have p-type conductivity with one selected from the group consisting of B, Al, Ga, and In.

8. The device of claim 1, wherein the first and second legs include a layer of graphene.

9. The device of claim 1, wherein a space between the first leg and the second leg ranges from 1 nm to 1 μm.

10. The device of claim 1, wherein the first and second legs have a same conductivity type as each other.

11. The device of claim 1, wherein the first and second terminals are formed of a same material as that of the first and second legs.

12. The device of claim 1, wherein the first and second terminals are formed of a different material from as that of the first and second legs.

13. The device of claim 1, wherein for each of the first and second legs, the entire second side surface is uneven and has a first end in direct contact with the first terminal and a second end in direct contact with the second terminal.

14. A thermoelectric generator, comprising:
first and second electrodes adjacent to each other;
a common electrode spaced apart from the first and second electrodes;
a first thermoelectric device provided between the first electrode and the common electrode to connect the first electrode to the common electrode; and
a second thermoelectric device provided between the second electrode and the common electrode to connect the second electrode to the common electrode,
wherein each of the first and second thermoelectric devices comprises
a first terminal;
a second terminal spaced apart from the first terminal;
a first leg provided between the first and second terminals to connect the first terminal with the second terminal; and
a second leg provided between the first and second terminals to connect the first terminal with the second terminal, the first and second legs facing each other,
wherein each of the first and second legs comprises a first side surface and an external second side surface facing each other and having different surface roughnesses from each other, the first side surface being flat and having a first end in direct contact with the first terminal and a second end in direct contact with the second terminal, a portion of the second side surface being disposed closer to the second terminal than the first terminal and being uneven so as to have a surface roughness which is different from that of the first side surface, and another portion of the second side surface being disposed closer to the first terminal than the second terminal and being uneven so as to have a surface roughness which is different from that of the first side surface.

15. The generator of claim 14, wherein for each of the first and second thermoelectric devices, the first and second legs are disposed in such a way that the first side surfaces thereof face each other.

16. The generator of claim 14, wherein the first thermoelectric device is configured to have n-type conductivity, and the second thermoelectric device is configured to have p-type conductivity.

17. A thermoelectric generator, comprising:
first and second electrodes adjacent to each other;
a common electrode spaced apart from the first and second electrodes;
a first leg provided between the common and first electrodes to connect the common electrode to the first electrode; and
a second leg provided between the common and second electrodes to connect the common electrode to the second electrode, the first and second legs facing each other,
wherein each of the first and second legs comprises a first side surface and an external second side surface facing each other and having different surface roughnesses from each other,
the first side surface of the first leg being flat and having a first end in direct contact with the first electrode and a second end in direct contact with the common electrode, a portion of the second side surface of the first leg being disposed closer to the first electrode than the common electrode and being uneven so as to have a surface roughness which is different from that of the first side surface of the first leg, and another portion of the second side surface of the first leg being disposed closer to the common electrode than the first electrode and being uneven so as to have a surface roughness which is different from that of the first side surface of the first leg.

18. The generator of claim 17, wherein the first and second legs are disposed in such a way that the second side surfaces thereof face each other, and the second side surfaces are rougher than the first side surfaces.

19. The generator of claim 17, wherein the first leg is an n-type nanowire, and the second leg is a p-type nanowire.

20. The generator of claim 17, wherein the first side surface of the second leg is completely flat and has a first end in direct contact with the second electrode and a second end in direct contact with the common electrode, a portion of the second side surface of the second leg being disposed closer to the second electrode than the common electrode and being uneven so as to have a surface roughness which is different from that of the first side surface of the second leg, and another portion of the second side surface of the second leg being disposed closer to the common electrode than the second electrode and being uneven so as to have a surface roughness which is different from that of the first side surface of the second leg.

* * * * *